United States Patent
Rhodes (10) Patent No.: US 6,838,742 B2
(45) Date of Patent: Jan. 4, 2005

(54) MULTI-TRENCH REGION FOR ACCUMULATION OF PHOTO-GENERATED CHARGE IN A CMOS IMAGER

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/787,155

(22) Filed: Feb. 27, 2004

(65) Prior Publication Data

US 2004/0178323 A1 Sep. 16, 2004

Related U.S. Application Data

(62) Division of application No. 10/424,807, filed on Apr. 29, 2003, now Pat. No. 6,730,980, which is a division of application No. 09/650,432, filed on Aug. 28, 2000, now Pat. No. 6,611,037.

(51) Int. Cl.[7] .............................................. H01L 31/00
(52) U.S. Cl. ...................................... 257/448; 257/461
(58) Field of Search ................................ 257/448, 461

(56) References Cited

U.S. PATENT DOCUMENTS

| | | |
|---|---|---|
| 4,374,700 A | 2/1983 | Scott et al. |
| 5,055,900 A | 10/1991 | Fossum et al. |
| 5,151,385 A | 9/1992 | Yamamoto et al. |
| 5,173,756 A | 12/1992 | Wong et al. |
| 5,319,604 A | 6/1994 | Imondi et al. |
| 5,461,425 A | 10/1995 | Fowler et al. |
| 5,471,515 A | 11/1995 | Fossum et al. |
| 5,541,402 A | 7/1996 | Ackland et al. |
| 5,576,763 A | 11/1996 | Ackland et al. |
| 5,608,243 A | 3/1997 | Chi et al. |
| 5,614,744 A | 3/1997 | Merrill |
| 5,625,210 A | 4/1997 | Lee et al. |
| 5,705,846 A | 1/1998 | Merrill |
| 5,708,263 A | 1/1998 | Wong |
| 5,721,425 A | 2/1998 | Merrill |
| 5,731,622 A | 3/1998 | Sugiyama et al. |
| 5,747,840 A | 5/1998 | Merrill |
| 5,751,032 A * | 5/1998 | Yu ............................. 257/233 |
| 5,757,045 A | 5/1998 | Tsai et al. |
| 5,770,878 A | 6/1998 | Beasom |
| 5,841,159 A * | 11/1998 | Lee et al. .................... 257/291 |
| 5,990,515 A | 11/1999 | Liu et al. |
| 6,001,684 A | 12/1999 | Shen |
| 6,008,103 A | 12/1999 | Hoepfner |
| 6,339,248 B1 * | 1/2002 | Zhao et al. ................. 257/461 |

OTHER PUBLICATIONS

Dickinson, A., et al., *A 256x256 CMOS Active Pixel Image Sensor with Motion Detection*, 1995 IEEE International Solid–State Circuits Conference, pps. 226–227.

Dickinson, A., et al., *Standard CMOS Active Pixel Image Sensors for Multimedia Applications*, Proceedings of Sixteenth Conference on Advanced Research in VLSI, Mar. 27–29, 1995, pps. 214–224.

Eid, E–S., et al., *A 256 x 256 CMOS Active Pixel Image Sensor*, Proc. SPIE vol. 2415, Apr. 1995, pps. 265–275.

Fossum, E., *CMOS Image Sensors: Electronic Camera On A Chip*, 1995 IEEE, pps. 17–25.

(List continued on next page.)

Primary Examiner—Allan R. Wilson
(74) Attorney, Agent, or Firm—Dickstein Shapiro Morin & Oshinsky LLP (57) ABSTRACT

A multiple-trench photosensor for use in a CMOS imager having an improved charge capacity. The multi-trench photosensor may be either a photogate or photodiode structure. The multi-trench photosensor provides the photosensitive element with an increased surface area compared to a flat photosensor occupying a comparable area on a substrate. The multi-trench photosensor also exhibits a higher charge capacity, improved dynamic range, and a better signal-to-noise ratio. Also disclosed are processes for forming the multi-trench photosensor.

7 Claims, 11 Drawing Sheets

OTHER PUBLICATIONS

Fossum, E., *Low Power Camera–on–a–Chip Using CMOS Active Pixel Sensor Technology*, 1995 IEEE, pps. 74–77.

Fossum, E., *Architectures for focal plane image processing*, Optical Engineering, vol. 28, No 8, Aug. 1989, pps. 865–871.

Janesick, J., et al., *New advancements in charge–coupled device technology—sub–electron noise and 4096×4096 pixel CCDs*, Proc. SPIE vol. 1242, 1990, pps. 223–237.

Kemeny, S.E., et al., *Update on focal–plane image processing research*, Proc. SPIE vol. 1447, 1991, pps. 243–250.

Mendis, S., et al., *CMOS Active Pixel Image Sensor*, IEEE Transactions on Electron Devices, vol. 41, No. 3, Mar. 1994, pps. 452–453.

Mendis, S.K., et al., *A 128 × 128 CMOS Active Pixel Image Sensor for Highly Integrated Imaging Systems*, 1993 IEEE, pps. 583–586.

Mendis, S.K., et al., *CMOS Active Pixel Image Sensors for Highly Integrated Imaging Systems*, IEEE Journal of Solid–State Circuits, vol. 32, No. 2, Feb. 1997, pps. 187–197.

Mendis, S.K., et al., *Design of a Low–Light–Level Image Sensor with On–Chip Sigma–Delta Analog–to–Digital Conversion*, Proc. SPIE vol. 1900, Jul. 1993, pps. 31–39.

Mendis, S.K., et al., *Low–Light–Level Image Sensor with On–Chip Signal Processing*, Proc. SPIE vol. 1952, Nov. 1993, pps. 23–33.

Mendis, S.K., et al., *Progress In CMOS Active Pixel Image Sensors*, Proc. SPIE vol. 2172, May 1994, pps. 19–29.

Nakamura, J., et al., *CMOS Active Pixel Image Sensor with Simple Floating Gate Pixels*, IEEE Transactions on Electron Devices, vol. 42, No. 9, Sep. 1995, pps. 1693–1694.

Nixon, R.H., et al., *256 × 256 CMOS Active Pixel Sensor Camera–on–a–Chip*, IEEE Journal of Solid–State Circuits, vol. 31, No. 12, Dec. 1996, pps. 2046–2050.

Nixon, R.H., et al., *256×256 CMOS Active Pixel Sensor Camara–on–a–Chip*, 1996 IEEE International Solid–State Circuits Conference, pps. 178–179.

Panicacci, R., et al., *Programmable multiresolution CMOS active pixel sensor*, Proc. SPIE vol. 2654, Mar. 1996, pps. 72–79.

Panicacci, R.A., et al., *128Mb/s Multiport CMOS Binary Active–Pixel Image Sensor*, 1996 IEEE International Solid–State Circuit Conference, pps. 100–101.

Yadid–Pecht, O., et al., *CMOS Active Pixel Sensor Star Tracker with Regional Electronic Shutter*, IEEE Journal of Solid–State Circuits, vol. 32, No. 2, Feb. 1997, pps. 285–288.

Yadid–Pecht, O., et al., *Wide dynamic range APS star tracker*, Proc. SPIE vol. 2654, Mar. 1996, pps. 82–92.

Zarnowski, J., et al., *Imaging options expand with CMOS technology*, Laser Focus World, Jun. 1997, pps. 125–130.

Zhou, Z., et al., *A Cmos Imager with On–Chip Variable Resolution for Light–Adaptive Imaging*, 1998 IEEE International Solid–State Circuits Conference, pps. 174–175.

Zhou, Z., et al., *A Digital CMOS Active Pixel Image Sensor For Multimedia Applications*, Proc. SPIE vol. 2894, Sep. 1996, pps. 282–288.

Fossum, E., et al., *IEDM A 37×28mm$^2$ 600k–Pixel CMOS APS Dental X–Ray Camera–on–a–Chip with Self–Triggered Readout*, 1998 IEEE International Solid–State Circuits Conference, pps. 172–173.

\* cited by examiner

MULTI-TRENCH REGION FOR ACCUMULATION OF PHOTO-GENERATED CHARGE IN A CMOS IMAGER

CROSS-REFERENCE TO RELATED APPLICATIONS

This application is a divisional of U.S. patent application Ser. No. 10/424,807, filed on Apr. 29, 2003 now U.S. Pat. No. 6,730,980, which in turn is a divisional U.S. patent application Ser. No. 09/650,432, filed on Aug. 28, 2000 now U.S. Pat. No. 6,611,037. Both of these applications are incorporated herein by reference.

BACKGROUND OF THE INVENTION

1. Field of the Invention

The invention relates generally to improved semiconductor imaging devices and in particular to a silicon imaging device which can be fabricated using a standard CMOS process. Particularly, the invention relates to a multi-trench region for accumulation of photo-generated charge in a CMOS imager.

2. Discussion of Related Art

There are a number of different types of semiconductor-based imagers, including charge coupled devices (CCDs), photodiode arrays, charge injection devices and hybrid focal plane arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A filly compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, a photodiode, or a photoconductor overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photodiode, or the photoconductor having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate or a photoconductor. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Figure 1:
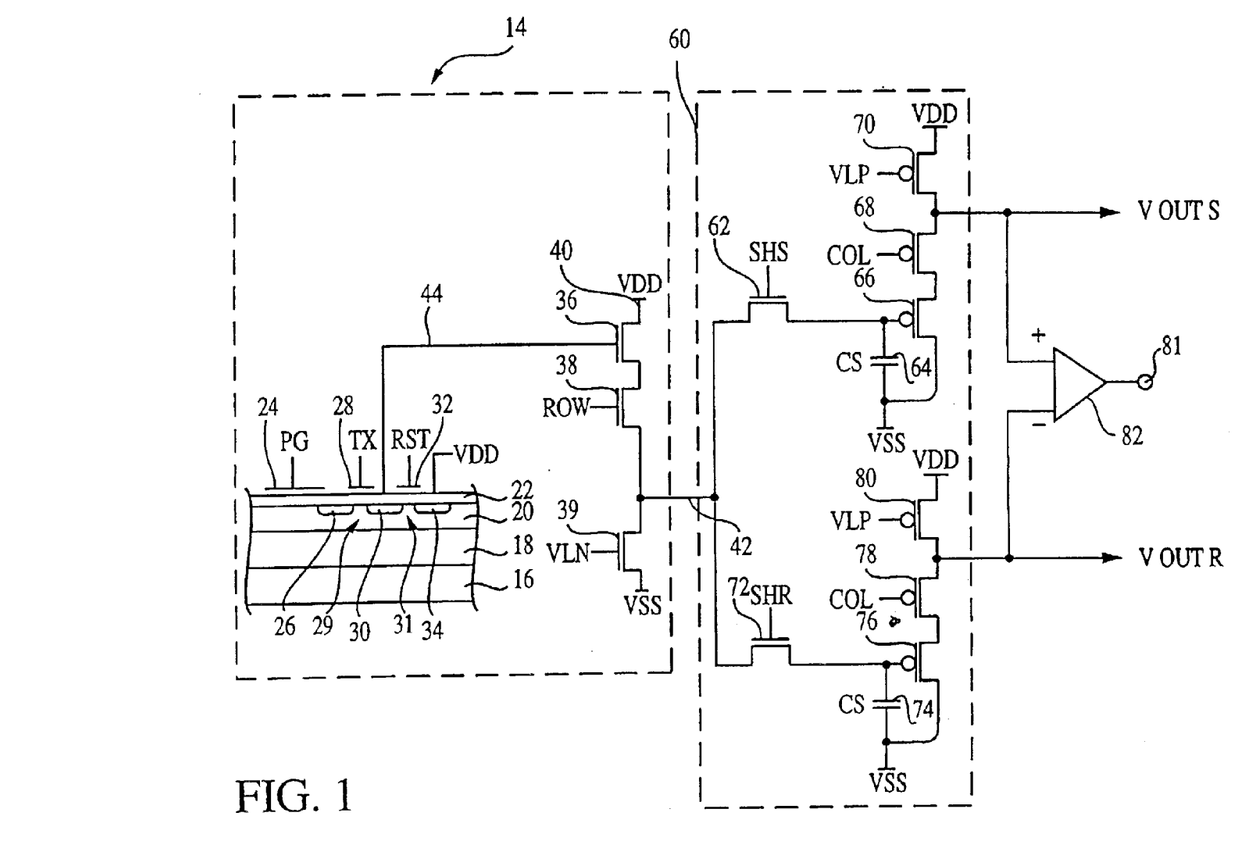
FIG. 1 is a representative circuit of a CMOS imager.

Reference is now made to FIG. 1 which shows a simplified circuit for a pixel of an exemplary CMOS imager using a photogate and having a pixel photodetector circuit 14 and a readout circuit 60. It should be understood that while FIG.

1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically of a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p− substrates, p on p+substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The gate of transistor 36 is coupled over lead 44 to n+ region 30. The drain of row select transistor 38 is connected via conductor 42 to the drains of similar row select transistors for other pixels in a given pixel row. A load transistor 39 is also coupled between the drain of transistor 38 and a voltage source VSS. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS-VOUTR) by subtractor 82 to provide an output signal terminal 81 which is an image signal independent of pixel to pixel variations caused by fabrication variations in the reset voltage transistor 31 which might cause pixel to pixel variations in the output signal.

Figure 2:
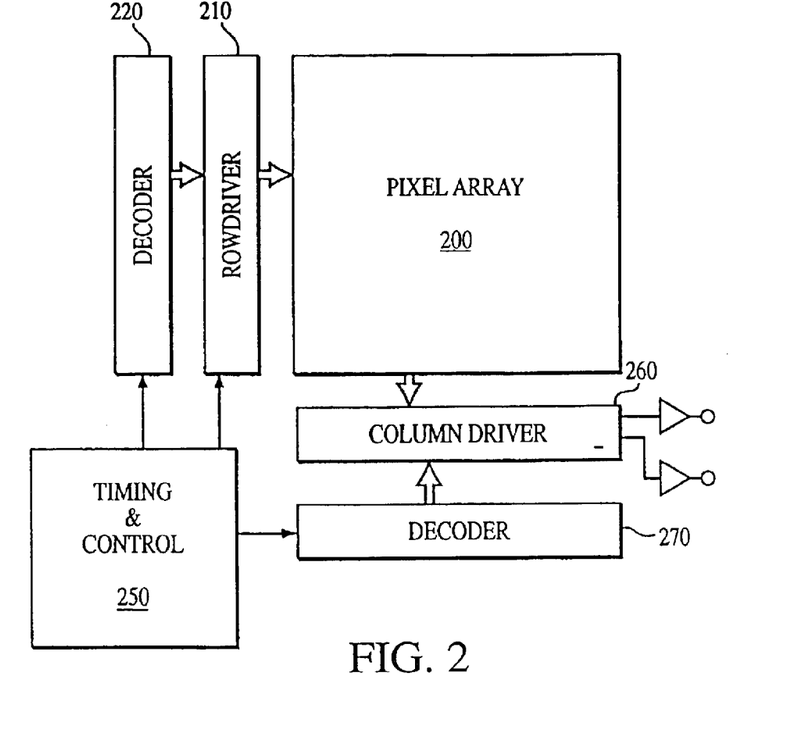
FIG. 2 is a block diagram of a CMOS active pixel sensor chip.
Figure 4:
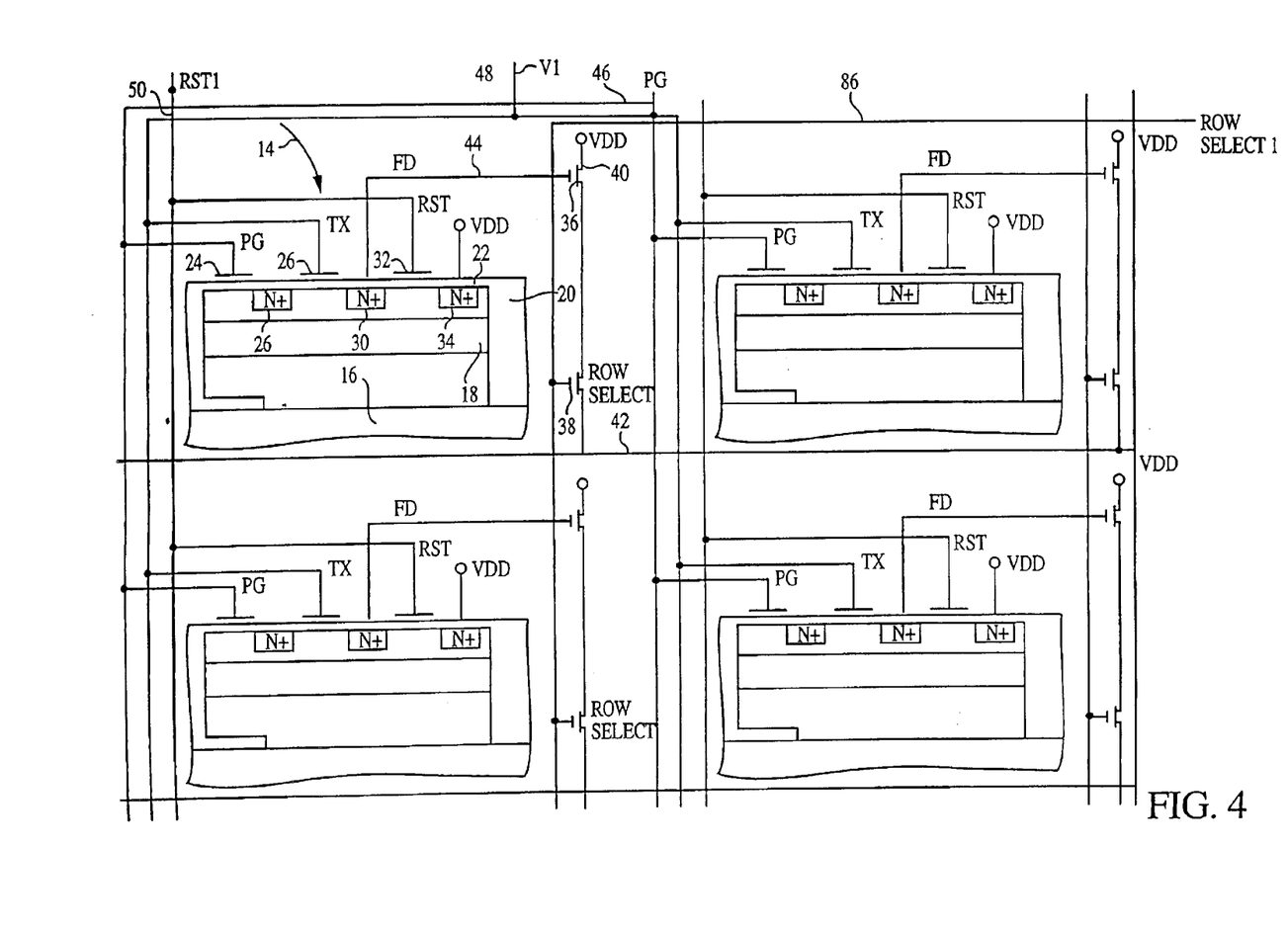
FIG. 4 is a representative pixel layout showing a 2×2 pixel layout of a CMOS imager.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns and rows. The pixels of each row in array 200 are all turned on at the same time by a row select line, e.g., line 86 (FIG. 4), and the pixels of each column are selectively output by a column select line, e.g., line 42 (FIG. 4). A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

Figure 3:
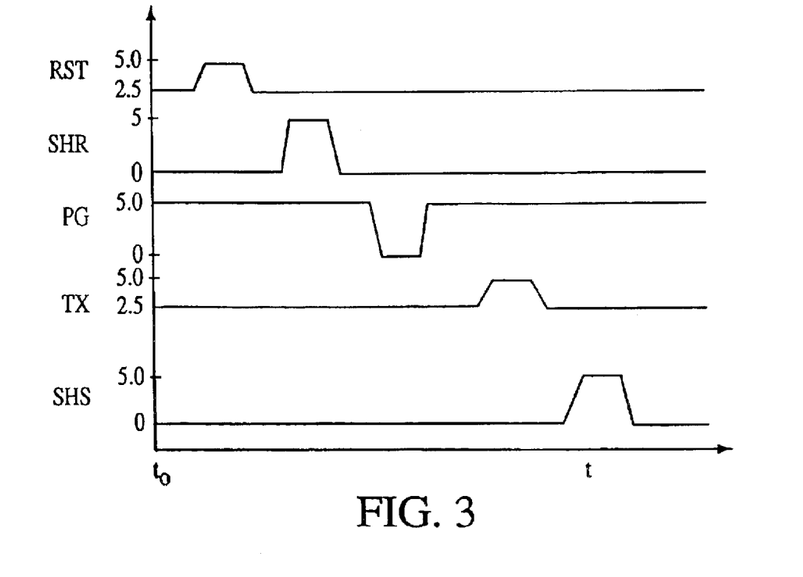
FIG. 3 is a representative timing diagram for the CMOS imager.

FIG. 3 shows a simplified timing diagram for the signals used to transfer charge out of photodetector circuit 14 of the FIG. 1 CMOS imager. The photogate signal PG is nominally set to 5V and the reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+region 34 (less the voltage drop Vth of transistor 31). This resets the floating diffusion node 30 to a predetermined voltage (VDD-Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage pulse TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be understood that CMOS imagers may dispense with the transistor gate 28 and associated transistor 29 or retain these structures while biasing the transfer transistor gate 28 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip, IEDM Vol. 95 pages 17–25 (1995) as well as other publications. These references are incorporated herein by reference.

Figure 5:
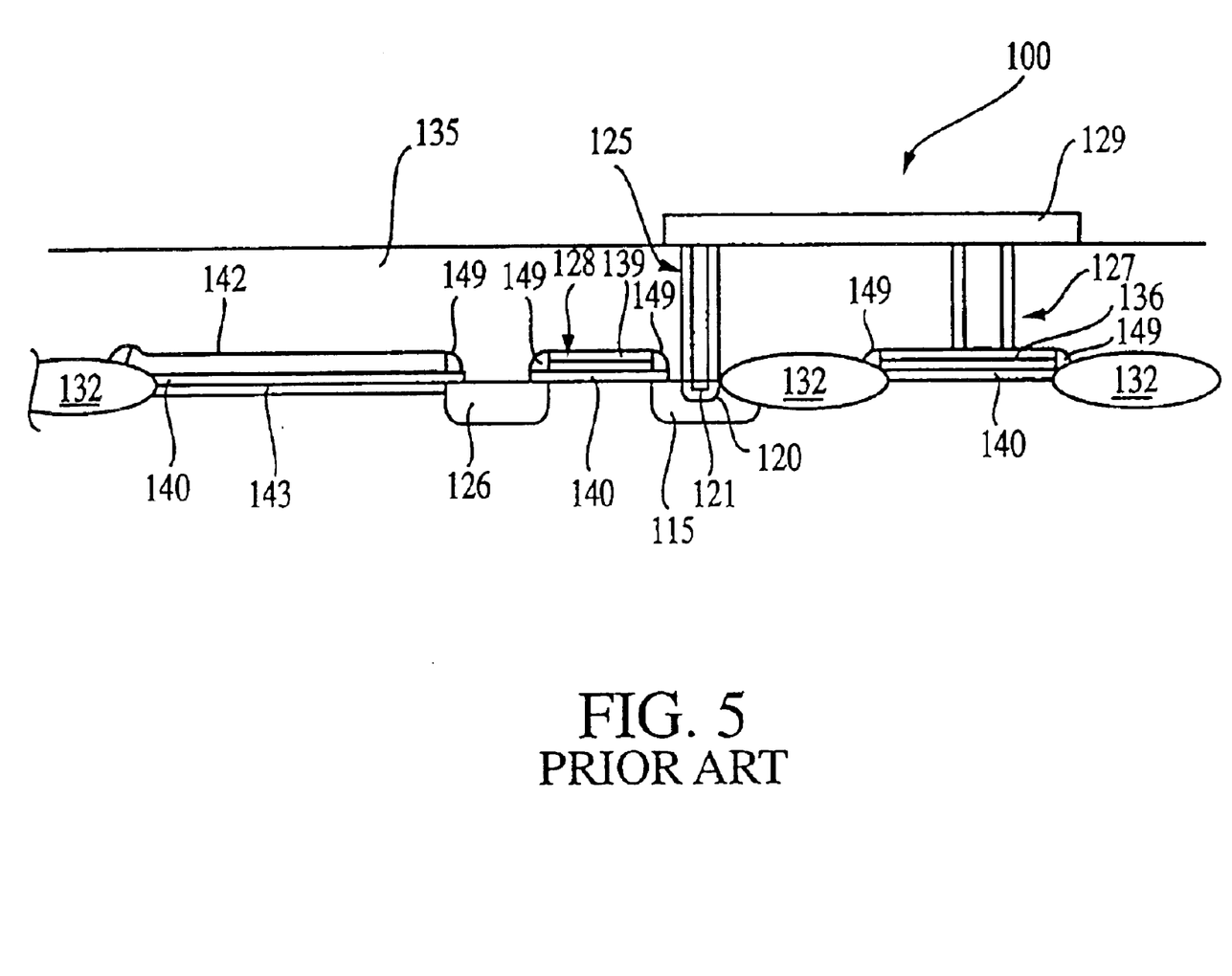
FIG. 5 is a partially cut away side view of a semiconductor imager having a photogate and a transfer gate according to the prior art.

FIG. 5 illustrates a portion of a prior CMOS imager having a photogate as the photoactive area and further includes a transfer gate. The imager 100 is provided with three doped regions 143, 126 and 115, which are doped to a conductivity type different from that of the substrate, for exemplary purposes regions 143, 126 and 115 are treated as n type, which are within a p-well of a substrate. The first doped region 143 is the photosite charge collector, and it underlies a portion of the photogate 142, which is a thin layer of material transparent or partially transparent to radiant energy, such as polysilicon. The first doped region 143 is typically an n-doped region. An insulating layer 140 of silicon dioxide, silicon nitride, or other suitable material is formed over a surface of the doped layer 143 of the substrate between the photogate 142 and first doped region 143.

The second doped region 126 transfers charge collected by the photogate 142 and it serves as the source for the transfer transistor 128. The transfer transistor 128 includes a transfer gate 139 formed over a gate oxide layer 140. The transfer gate 139 has insulating spacers 149 formed on its sides.

The third doped region 115 is the floating diffusion region and is connected to a gate 136 of a source follower transistor by contact lines 125, 127, 129 which are typically metal contact lines as described in more detail below. The imager 100 typically includes a highly n+ doped region 120 within n-doped region 115 under the floating diffusion region contact 125 which provides good ohmic contact of the contact 125 with the n-doped region 115. The floating diffusion contact 125 connects n+region 120 of the floating diffusion region with the gate 136 of the source follower transistor. In other embodiments of the prior art, the entire region 115 may be doped n+thereby eliminating the need for n+region 120.

The source and drain regions of the source follower transistor are not seen in FIG. 5 as they are perpendicular to the page but are on either side of gate 136. The source follower gate 136 is usually formed of a doped polysilicon which may be silicided and which is deposited over a gate oxide 140, such as silicon dioxide. The floating diffusion contact 125 is usually formed of a tungsten plug, typically a Ti/TiN/W metallization stack. The floating diffusion contact 125 is formed in an insulating layer 135 which is typically an undoped oxide followed by the deposition of a doped oxide such as a BPSG layer deposited over the substrate. The tungsten metal which forms the floating diffusion/source follower contact 125 is typically deposited using a tungsten fluoride such as $WF_6$.

Typically, the layer 135 must be etched with a selective dry etch process prior to depositing the tungsten plug connector 125. The imager 100 also includes a source follower contact 127 formed in layer 135 in a similar fashion to floating diffusion contact 125. Source follower contact 127 is also usually formed of a tungsten plug typically a Ti/TiN/W metallization stack. The floating diffusion contact 125 and the source follower contact 127 are connected by a metal layer 129 formed over layer 135. Typically metal layer 129 is formed of aluminum, copper or any other metal.

Separating the source follower transistor gate 136 and the floating diffusion region 115 is a field oxide layer 132, which serves to surround and isolate the cells. The field oxide 132 may be formed by thermal oxidation of the substrate or in the Local Oxidation of Silicon (LOCOS) or by the Shallow Trench Isolation (STI) process which involves the chemical vapor deposition of an oxide material.

It should be understood that while FIG. 5 shows an imager having a photogate as the photoactive area and additionally includes a transfer transistor, additional imager structures are also well known. For example, CMOS imagers having a photodiode or a photoconductor as the photoactive area are known. Additionally, while a transfer transistor has some advantages as described above, it is not required.

There are drawbacks, however, with prior CMOS imagers. Prior CMOS pixel photosensors suffer dynamic range and charge capacity limitations, and undesirably low signal-to-noise ratios. Attempts to increase charge capacity and improve signal-to-noise ratios have typically focused on using photogate photosensors instead of photodiodes, adding transfer gate stacks to enhance charge transfer, and increasing the size of the photosensor. These methods add process complexity, may limit the use of advantageous features such as silicided gates, and may result in increased pixel cell sizes, thereby reducing pixel array densities.

There is a need, therefore, for an improved photosensor for use in an image that exhibits improved dynamic range, a better signal-to-noise ratio, and improved charge capacity for longer integration times.

SUMMARY OF THE INVENTION

The present invention provides a CMOS imager having a multiple trench photosensor formed in a doped semiconductor substrate for use in a pixel sensor cell. Each trench comprises a doped region on the sides and bottom, with a conductive layer formed over the doped region. For a photogate-type photosensor, a dielectric layer is preferably formed on the sides and bottom of each trench prior to forming the conductive layer.

The multi-trench photosensor provides the photosensitive element with an increased surface area compared to a flat photosensor occupying a comparable area on a substrate. The multi-trench photosensor also exhibits a higher charge capacity, improved dynamic range, and a better signal-to-noise ratio.

The above and other advantages and features of the invention will be more clearly understood from the following detailed description which is provided in connection with the accompanying drawings.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

In accordance with the present invention, a multiple trench photosensor for use in a pixel sensor cell of a CMOS imager is provided. Each trench comprises a doped region on the sides and bottom, with a conductive layer formed over the doped region. The multi-trench photosensor provides the photosensitive element with an increased surface area compared to a flat photosensor occupying a comparable area on a substrate. The multi-trench photosensor also exhibits a higher charge capacity, improved dynamic range, and a better signal-to-noise ratio.

Figure 6:
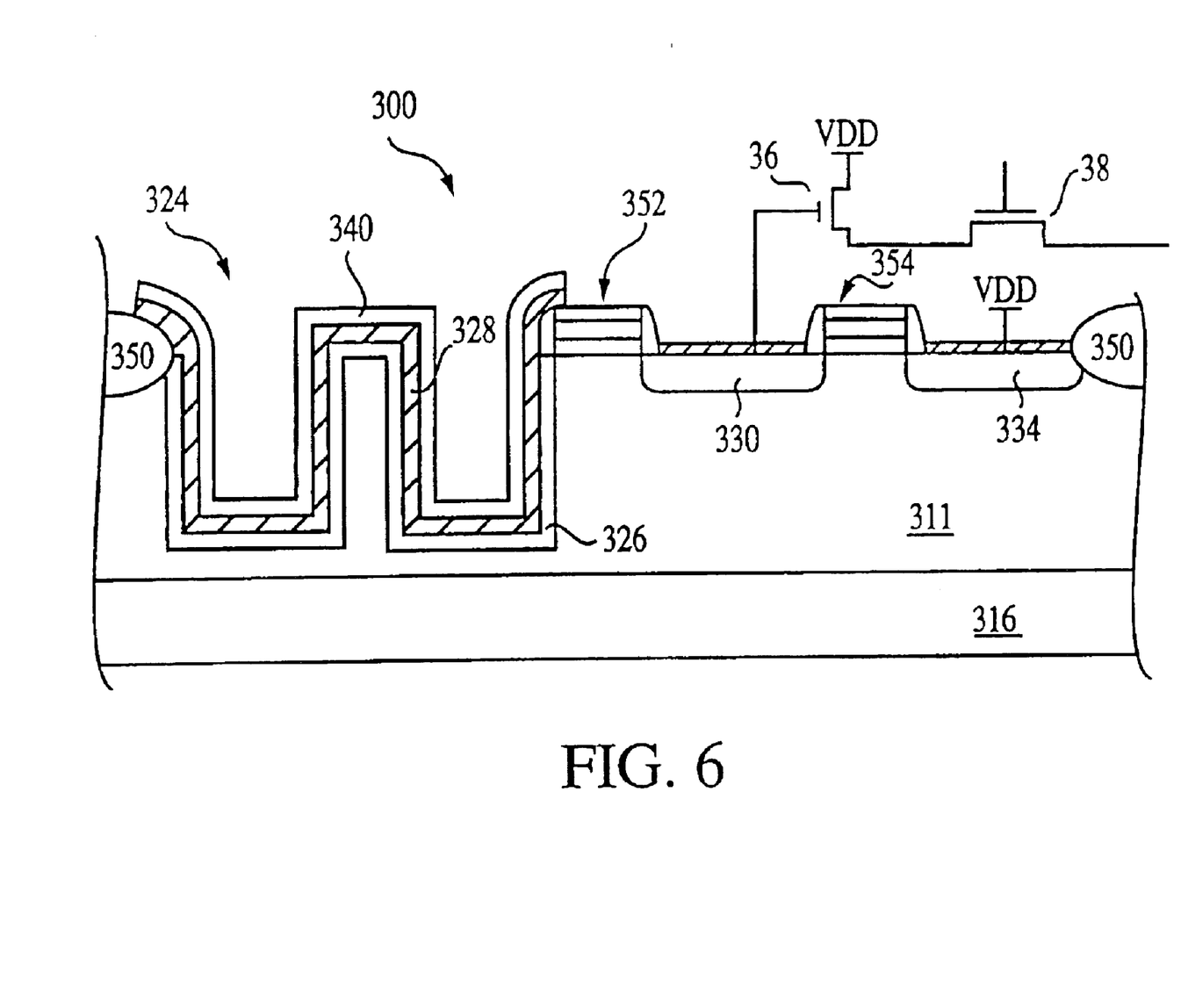
FIG. 6 shows a partially cut away side view of a semiconductor imager having a multi-trench photosensor according to the present invention.

The invention is now described with reference to FIGS. 6–13. FIG. 6 shows a partially cut away cross-sectional view of a CMOS semiconductor wafer according to the present invention. It should be understood that similar reference numbers correspond to similar elements for FIGS. 6–13.

The structure of the pixel cell 300 according to one embodiment is shown in more detail in FIG. 6. The pixel cell 300 may be formed in a substrate 316 having a doped layer or well 311 of a first conductivity type, which for exemplary purposes is treated as a p-type substrate. It should be understood that the CMOS imager of the present invention can also be fabricated using p-doped regions in an n-well. The doped layer 311 is provided with three doped regions 326, 330 and 334, which are doped to a second conductivity type, which for exemplary purposes is treated as n-type. The first doped region 326 is the photosite, and it underlies a conductive layer 340 of material transparent to radiant energy, such as polysilicon. The photosite 326 and conductive layer 340 together form a multi-trench photosensor 324 in accordance with the present invention. An insulating layer 328 of silicon dioxide, silicon nitride, ON (oxide-nitride), NO (nitride-oxide), ONO (oxide-nitride-oxide) or other suitable material is formed between the conductive layer 340 and the photosite 326. If a deposited insulating layer 328 is used (as opposed to a grown layer), it may extend over a pixel-isolating field region 350 on the opposite side of the photosensor 324 from the transfer gate 352 as illustrated. The second doped region 330 is the floating diffusion region, sometimes also referred to as a floating diffusion node, and it serves as the source for the reset transistor 354. The third doped region 334 is the drain of the reset transistor 354, and is also connected to voltage source $V_{DD}$.

Figure 7:
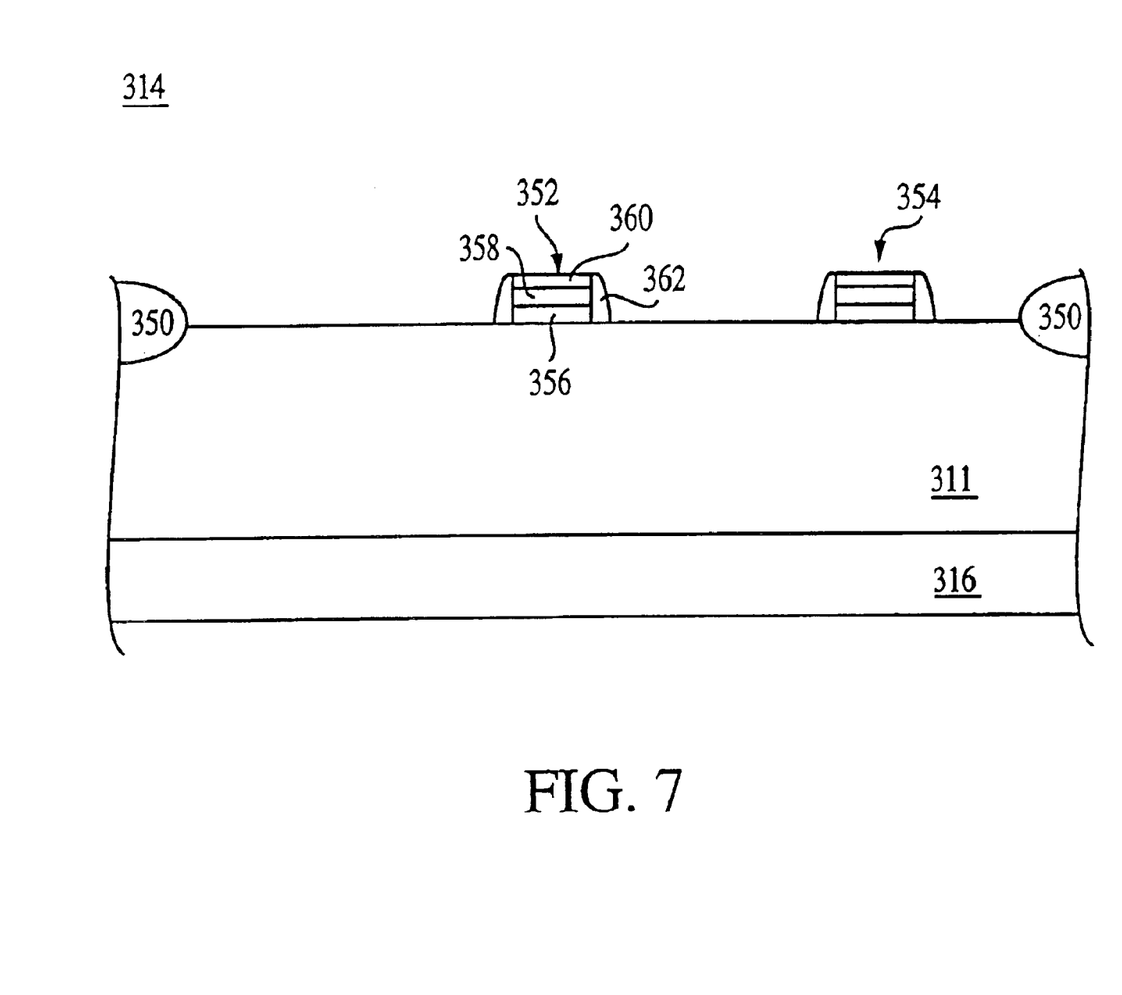
FIG. 7 shows a partially cut away side view of a semiconductor imager of a first embodiment of the present invention at an intermediate step of processing.

The multi-trench photosensor 324 of the present invention is manufactured through a process described as follows, and illustrated by FIGS. 7 through 12. Referring now to FIG. 7, a substrate 316, which may be any of the types of substrates described above, is doped to form a doped substrate layer or well 311 of a first conductivity type, which for exemplary purposes will be described as p-type. A field oxide layer 350 is formed around the cell 314 at this time, and is shown in FIG. 6 as residing on a side of the photosite 324 opposite the transfer gate 352 and adjacent to the third doped region 334. The field oxide layer 350 may be formed by any known technique such as thermal oxidation of the underlying silicon in a LOCOS process or by etching trenches and filling them with oxide in an STI process.

Next, the reset transistor gate stack 354 and an optional transfer gate stack 352 are formed. These include a silicon dioxide or silicon nitride insulator 356 on the doped layer 311, and a conductive layer 358 of doped polysilicon, tungsten, or other suitable material over the insulating layer 356. An insulating cap layer 360 of, for example, silicon dioxide, silicon nitride, ON, NO, or ONO may be formed if desired; also a more conductive layer such as a silicide layer (not shown) may be used between the conductive layer 358 and the cap 360. Insulating sidewalls 362 are also formed on the sides of the gate stacks 352, 354. These sidewalls 362 may be formed of, for example, silicon dioxide, silicon nitride, ON, NO or ONO.

Figure 8:
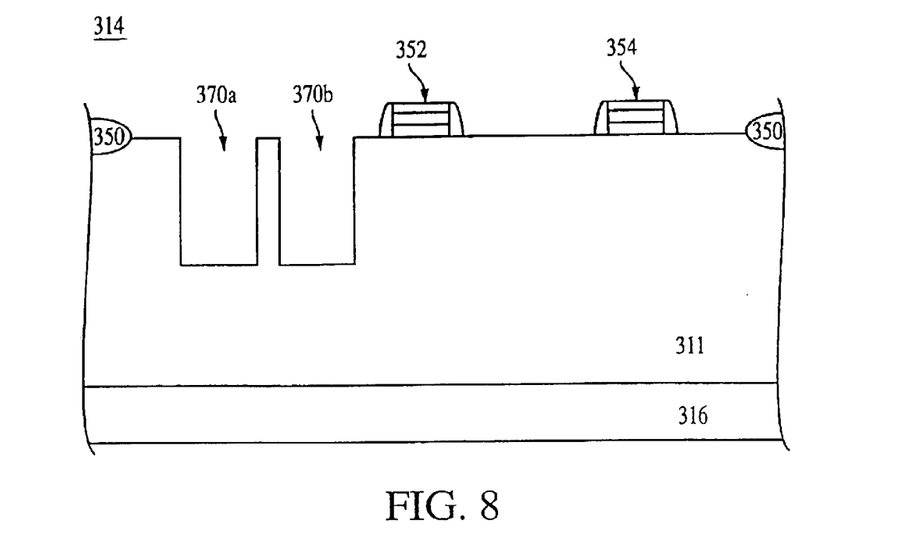
FIG. 8 shows a partially cut away side view of a semiconductor imager of the present invention at a processing step subsequent to FIG. 7.

As shown in FIG. 8, the next step is to form multiple trenches in the doped layer 311. A resist and mask (not shown) are applied, and photolithographic techniques are used to define the area to be etched-out. A directional etching process such as Reactive Ion Etching (RIE), or etching with a preferential anisotropic etchant is used to etch into the doped layer 311 to a sufficient depth, e.g., about 0.05 to 10 μm, to form a pair of trenches 370a, 370b. While two trenches 370a, 370b are illustrated in FIG. 8, the invention is not so limited and any number of trenches may be formed. However, the number of trenches that may be formed is limited by the size of each pixel. The deeper each trench 370a, 370b, the higher the charge storage capacitance of each trench and subsequently of the imager. The resist and mask are removed, leaving a structure that appears as shown in FIG. 8.

While the gate stacks may be formed after the trenches 370a, 370b are etched, for exemplary purposes and for convenience etching of the trenches is described as occurring subsequent to gate stack formation. The order of these preliminary process steps may be varied as is required or convenient for a particular process flow, for example, if a photogate sensor which overlaps the transfer gate is desired, the gate stacks must be formed before the photogate, but if a non-overlapping photogate is desired, the gate stacks are preferably formed after photogate formation. Similarly, fabrication of a photodiode photosensor is greatly simplified if the gate stacks are fabricated before the trench is etched.

Figure 9:
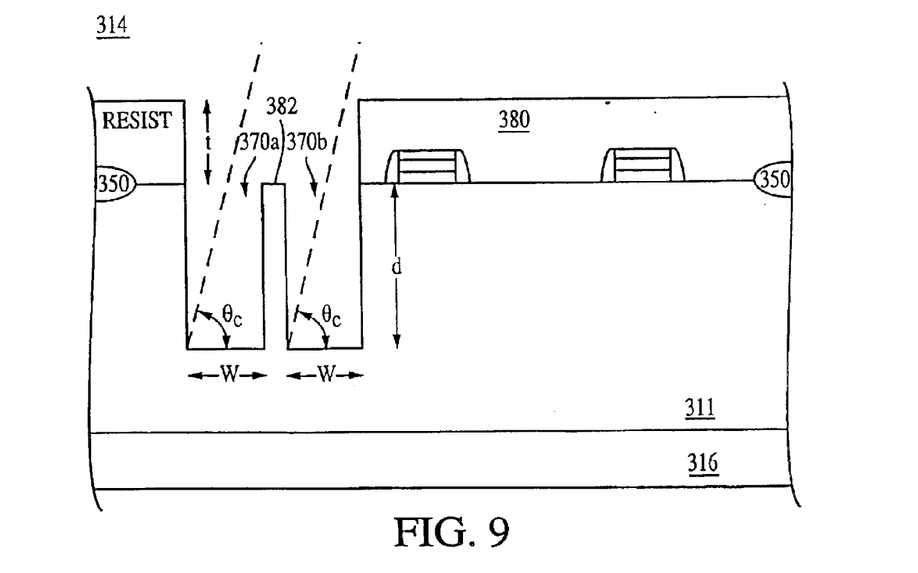
FIG. 9 shows a partially cut away side view of a semiconductor imager of the present invention at a processing step subsequent to FIG. 8.
Figure 10:
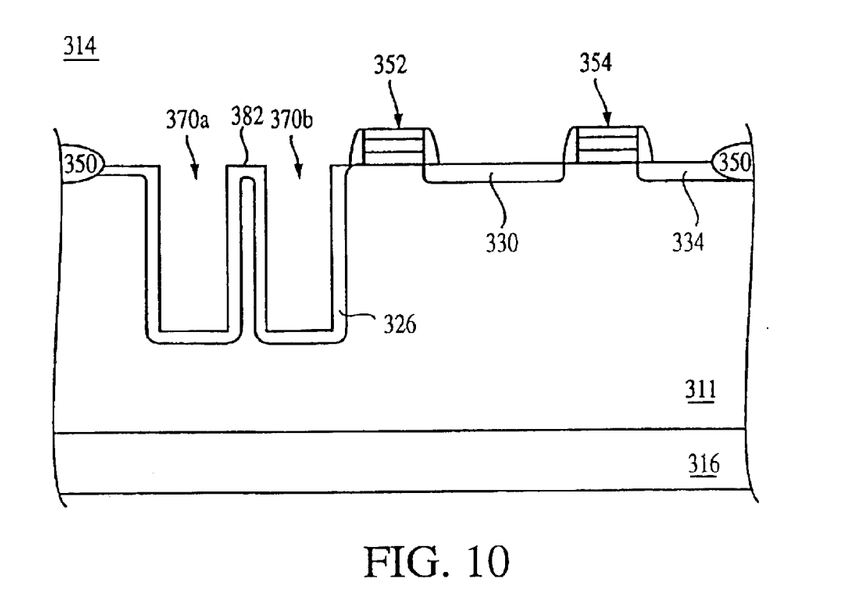
FIG. 10 shows a partially cut away side view of a semiconductor imager of the present invention at a processing step subsequent to FIG. 9.

In the next step of the process, illustrated in FIGS. 9 and 10, doped regions are formed in the doped substrate layer 311 by any suitable doping process, such as ion implantation. A resist and mask (not shown) are used to shield areas of the layer 311 that are not to be doped. Three doped regions are formed in this step: the photosite 326, which is formed in the sides and bottom of each trench 370a, 370b; the floating diffusion region 330; and a drain region 334 as illustrated in FIG. 10.

The ion implantation of doped region 326 is preferably performed as a series of angled implants, typically four, to assure a more uniformly doped trench sidewall. FIG. 9 illustrates a resist layer 380 which covers all of the surface of the substrate layer 311 except the trenches 370a, 370b, and the region 382 between the trenches 370a, 370b, to be doped. The implants are performed at implantation angles $\theta_I$ that are greater than the critical angle $\theta_c$, where each implant is orthogonal to the last implant performed. The value of $\theta_c$ is calculated according to the equation $\tan \theta_c = [(t+d)/(w)]$, where t is the thickness of the resist 380, d is the depth of the trenches 370a, 370b, and w is the width of each trench 370a, 370b. The dose of each implant is between $1 \times 10^{12}$ ions/cm$^2$ and $1 \times 10^{16}$ ions/cm$^2$, preferably between $1 \times 10^{13}$ ions/cm$^2$ and $1 \times 10^{15}$ ions/cm$^2$, and most preferably about $5 \times 10^{13}$ ions/cm$^2$.

After formation of the first doped region 326, the resist 380 and mask are stripped, and a second resist and mask (not shown) are applied. Standard ion implantation is then performed to dope the second and third doped regions 330, 334. As shown in FIG. 10, the doped regions 326, 330, 334 are doped to a second conductivity type, which for exemplary purposes will be considered to be n-type. The doping level of the doped regions 326, 330, 334 may vary but should be of comparable or greater strength than the doping level of the doped layer 311. Doped region 326 may be variably doped, such as either n+ or n− for an n-channel device. Doped region 334 should be strongly doped, i.e., for an n-channel device, the doped region 334 will be doped as n+. Doped region 330 is typically strongly doped (n+), and would not be lightly doped (n−) unless a buried contact is also used. If desired, multiple masks and resists may be used to dope regions 330, 334 to different levels.

Figure 11:
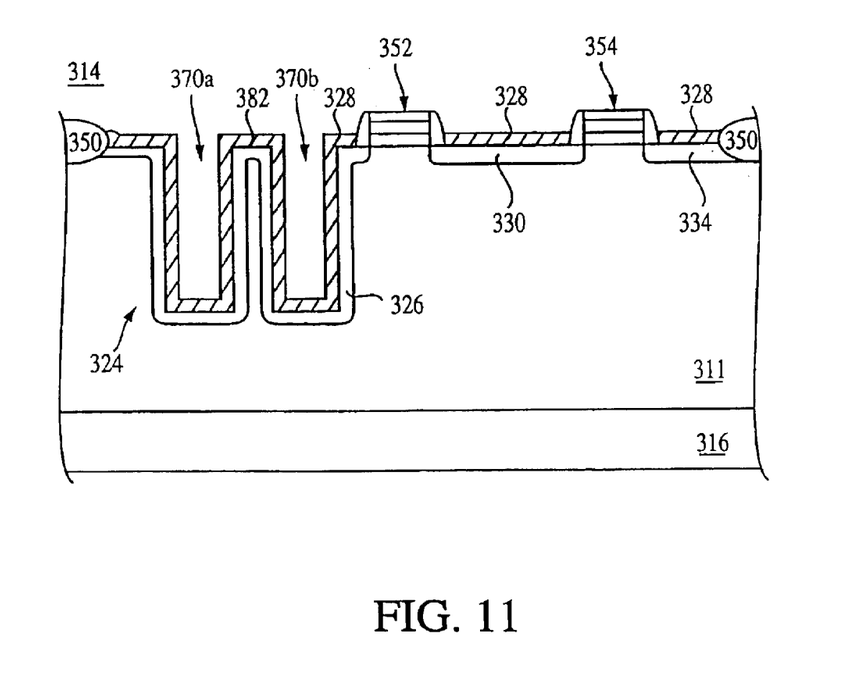
FIG. 11 shows a partially cut away side view of a semiconductor imager of the present invention at a processing step subsequent to FIG. 10.

Referring now to FIG. 11, an insulating layer 328 may now be formed on the sides and bottom of each trench 370a, 370b, and the region 382 between the trenches 370a, 370b, by chemical vapor deposition, thermal oxidation or other suitable means. The insulating layer 382 can abut the insulating sidewall 362 of gate stack 352, or can partially overlap a portion of gate stack 352 as illustrated in FIG. 6. The insulating layer 382 may be of silicon dioxide, silicon nitride, NO, ON, ONO, or other suitable material, and it has a thickness of approximately 20 to 500 Angstroms for a photogate photosensor. If a photodiode is formed instead of a photogate, the insulating layer 328 would typically be at least 30 Angstroms thick, and may, with the addition of further insulating and passivating layers on the device, be approximately 5 microns thick.

Figure 12:
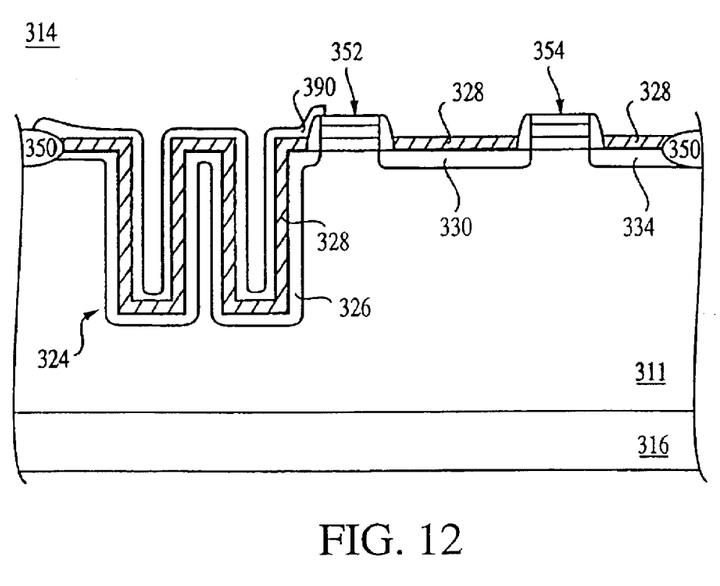
FIG. 12 shows a partially cut away side view of a semiconductor imager of the present invention at a processing step subsequent to FIG. 11.

As shown in FIG. 12, the final step in the process of the present invention is to form the photogate 324. The photogate 324 has a thin conductive layer 390 that is at least partially transparent to electromagnetic radiation of the wavelengths desired to be sensed. The conductive layer 390 is of a first conductivity type, and may be doped polysilicon, indium tin oxide, tin oxide, or other suitable material. The thickness of the conductive layer 390 may be any suitable thickness, e.g., approximately 200 to 4000 Angstroms. If the conductive material is a silicon material, then the conductive layer 390 will be formed by CVD or other suitable means, and if the conductive material is a metal compound, CVD, evaporation or sputtering are preferred means of forming the conductive layer 390. The conductive layer 390 is formed to cover substantial portions of the insulating layer 328, and may extend at least partially over the field oxide layer 350 and a portion of the transfer gate 328. The photosensor 324 at this stage is shown in FIG. 12.

For the pixel cell 300 of the first embodiment, the photosensor 324 is essentially complete at this stage, and conventional processing methods may then be used to form contacts and wiring to connect gate lines and other connections in the pixel cell 300. For example, the entire surface may then be covered with a passivation layer of, e.g., silicon dioxide, BSG, PSG, or BPSG, which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 13:
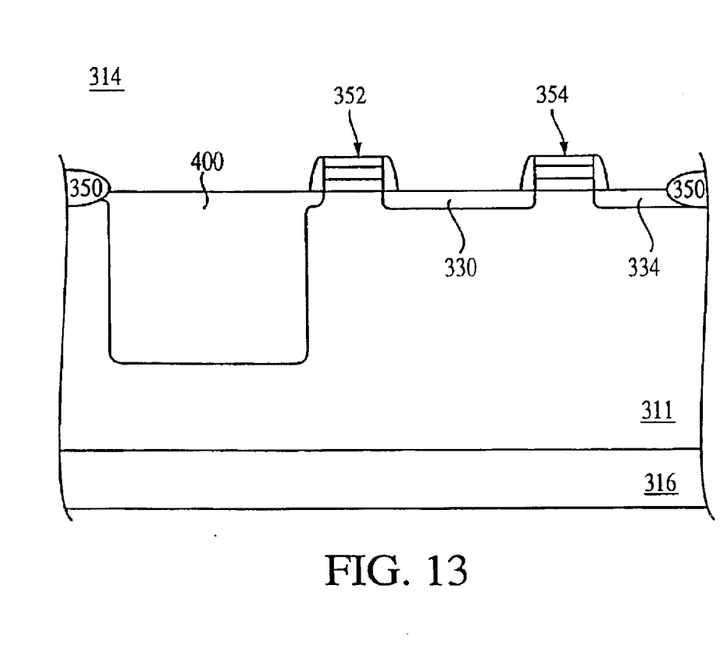
FIG. 13 shows the wafer of FIG. 7 undergoing an alternative process according to an embodiment of the present invention.
Figure 14:
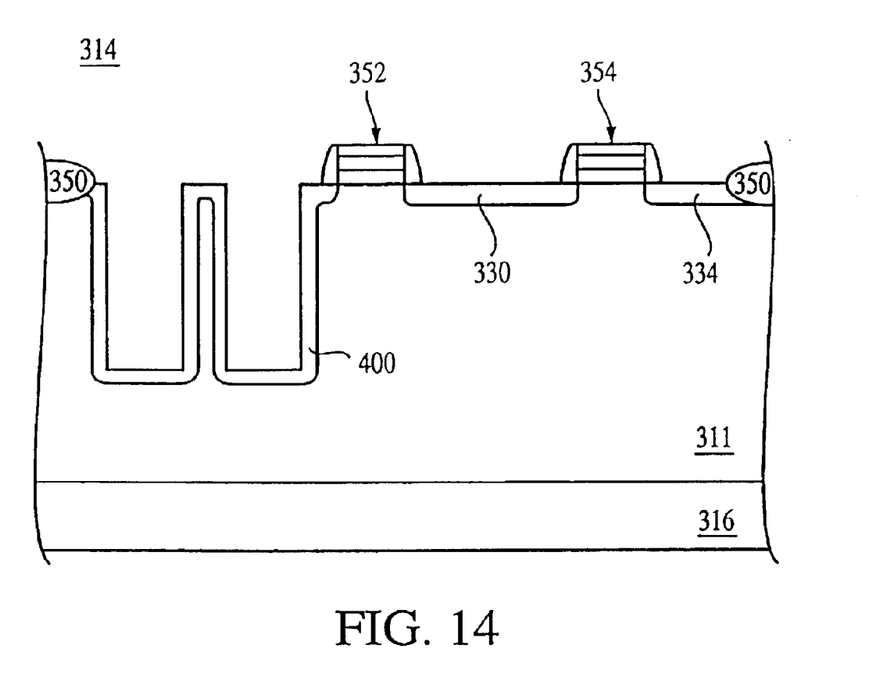
FIG. 14 shows the wafer of FIG. 13 at a processing step subsequent to that shown in FIG. 12.

An alternative embodiment of the process is illustrated by FIG. 6 and FIGS. 13 and 14. As shown in FIG. 6, this process also begins with a substrate 316 having a doped layer or well 311 of a first conductivity type, e.g., p-type, on which the transfer gate 352 and the reset transistor gate 354 have been formed. Referring now to FIG. 13, the next step in the alternative process is to form doped regions 330, 334 and a deep doped well 400 in the doped layer 311. A resist and mask (not shown) are used to expose only the areas to be doped, and a suitable doping process, such as ion implantation, is used to form a deep well 400 of a second conductivity type, e.g., n-type, in the doped layer 311. The doped regions 330, 334 may also be formed at this time by ion implantation or other suitable means.

As shown in FIG. 14, the next step is to form the multiple trenches in the well 400. A resist and mask (not shown) are applied, and photolithographic techniques are used to define the area to be etched-out. A directional etching process such as Reactive Ion Etching (RIE), or etching with a preferential anisotropic etchant is used to etch into the well 400 to a sufficient depth, e.g., about 0.05 to 10 $\mu$m to form the pair of trenches 370a, 370b. The depth of the trenches should be sufficient to form the photosensor 324 of the present invention therein. The resist and mask are removed, leaving a structure that appears as shown in FIG. 14. The photosensor 324 is then further formed according to the process described above in conjunction with reference to FIGS. 11 and 12.

Pixel arrays having the photosensors of the present invention, and described with reference to FIGS. 6–14, may be further processed as known in the art to arrive at CMOS imagers having the functions and features of those discussed with reference to FIGS. 1–4 and having the multi-trench photosite of the present invention.

Figure 15:
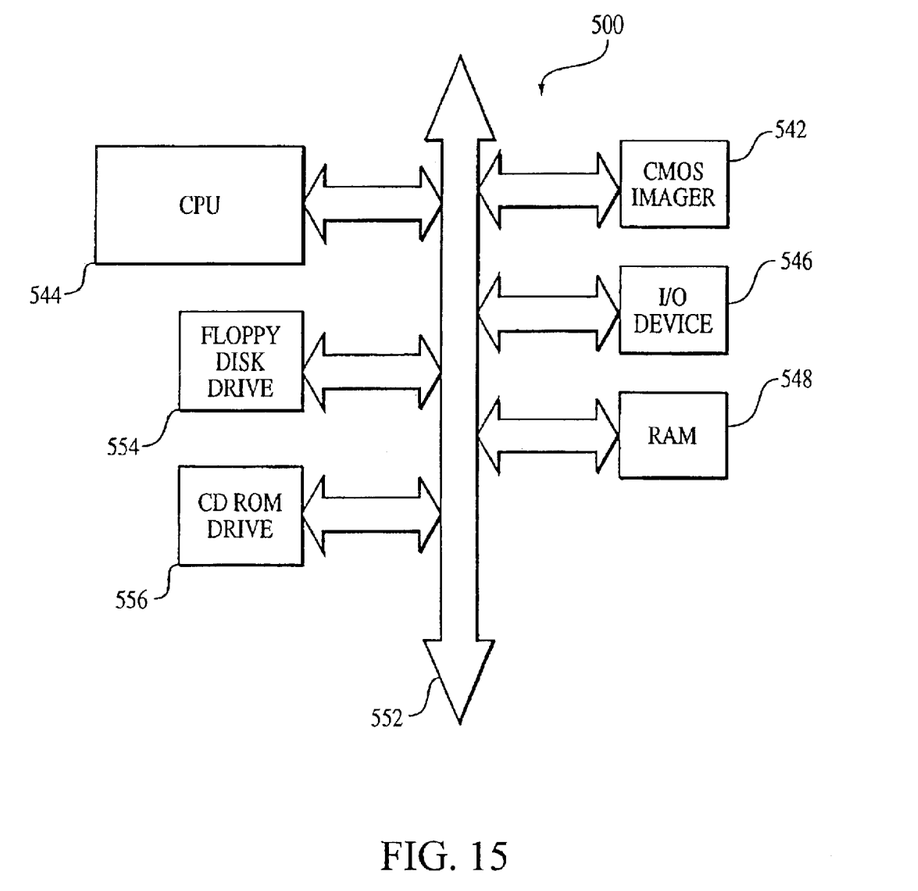
FIG. 15 is an illustration of a computer system having a CMOS imager according to the present invention.

A typical processor based system which includes a CMOS imager device according to the present invention is illustrated generally at 500 in FIG. 15. A processor based system is exemplary of a system having digital circuits which could include CMOS imager devices. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 544, for example, a microprocessor, that communicates with an input/output (I/O) device 546 over a bus 552. The CMOS imager 542 also communicates with the system over bus 552. The computer system 500 also includes random access memory (RAM) 548, and, in the case of a computer system may include peripheral devices such as a floppy disk drive 554 and a compact disk (CD) ROM drive 556 which also communicate with CPU 544 over the bus 552. CMOS imager 542 is preferably constructed as an integrated circuit which includes pixels containing a photosensor such as a photogate or photodiode formed with multiple trenches, as previously described with respect to FIGS. 6–14. It may also be desirable to integrate the processor 554, CMOS imager 542 and memory 548 on a single IC chip.

As can be seen by the embodiments described herein, the present invention encompasses a photosensor such as a photogate or photodiode formed in multiple trenches. The multiple trench photosensor has an improved charge capacity due to the increase in surface area of the multiple trench photosensor compared to conventional flat photosensors.

It should be noted that although the invention has been described with specific reference to CMOS imaging circuits having a photogate and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A pixel sensor cell for use in an imaging device, said pixel sensor cell comprising:

a plurality of trench photosensors formed in a doped layer of a first conductivity type of a substrate;

a reset transistor formed in said doped layer and a floating diffusion region of a second conductivity type formed in said doped layer between said plurality of trench photosensors and the reset transistor for receiving charges from said plurality of trench photosensors, said reset transistor operating to periodically reset a charge level of said floating diffusion region; and an output transistor having a gate electrically connected to the floating diffusion region.

2. The pixel sensor cell of claim 1, wherein each of said plurality of trench photosensors further comprises a doped region of a second conductivity type located on the sidewalls and bottom of each of said plurality of trenches.

3. The pixel sensor cell of claim 1, wherein each of said plurality of trench photosensors is a photodiode sensor.

4. The pixel sensor cell of claim 1, further comprising a transfer gate located between the plurality of trench photosensors and the floating diffusion region.

5. The pixel sensor cell of claim 4, wherein each of said plurality of trench photosensors is a photogate sensor.

6. The pixel sensor cell of claim 1, wherein the first conductivity type is p-type, and the second conductivity type is n-type.

7. The pixel sensor cell of claim 1, wherein said plurality of trench photosensors comprises two trench photosensors.

* * * * *

UNITED STATES PATENT AND TRADEMARK OFFICE
CERTIFICATE OF CORRECTION

| | | |
|---|---|---|
| PATENT NO. | : 6,838,742 B2 | |
| APPLICATION NO. | : 10/787155 | |
| DATED | : January 4, 2005 | |
| INVENTOR(S) | : Howard E. Rhodes | |

It is certified that error appears in the above-identified patent and that said Letters Patent is hereby corrected as shown below:

In the Specification, the following errors are corrected:

Column 1, line 43, "has been" should read --have been--;

Column 1, line 54, "filly" should read --fully--; and

Column 5, line 50, "Eric R, Fossum" should read --Eric R. Fossum--.

Signed and Sealed this

Sixth Day of February, 2007

JON W. DUDAS
*Director of the United States Patent and Trademark Office*